United States Patent
Starr et al.

(10) Patent No.: US 6,856,180 B1
(45) Date of Patent: Feb. 15, 2005

(54) PROGRAMMABLE LOOP BANDWIDTH IN PHASE LOCKED LOOP (PLL) CIRCUIT

(75) Inventors: Gregory W. Starr, San Jose, CA (US); Wanli Chang, Saratoga, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/138,595

(22) Filed: May 3, 2002

Related U.S. Application Data

(60) Provisional application No. 60/289,268, filed on May 6, 2001, and provisional application No. 60/289,245, filed on May 6, 2001.

(51) Int. Cl.$^7$ ............................................. H03L 7/06
(52) U.S. Cl. ........................................ 327/147; 327/156
(58) Field of Search ........................... 331/17, 16, 1 R, 331/25, 23; 327/145–150, 155–159

(56) References Cited

U.S. PATENT DOCUMENTS

| | | | |
|---|---|---|---|
| 4,475,208 A | 10/1984 | Ricketts ........................ 380/34 |
| 4,521,744 A | 6/1985 | Yamada et al. ............... 331/1 A |
| 5,058,204 A | * 10/1991 | Tahernia et al. .......... 455/183.1 |
| 5,144,173 A | 9/1992 | Hui ............................. 327/277 |
| 5,256,980 A | 10/1993 | Itri .............................. 327/105 |
| 5,319,735 A | 6/1994 | Preuss et al. ................. 704/205 |
| 5,453,706 A | 9/1995 | Yee ............................... 326/93 |
| 5,625,358 A | * 4/1997 | Wilson et al. ................ 341/143 |
| 5,631,920 A | 5/1997 | Hardin ......................... 375/130 |
| RE35,650 E | 11/1997 | Partyka et al. ............... 375/141 |
| 5,712,595 A | 1/1998 | Yokoyama .................... 331/2 |
| 5,737,329 A | 4/1998 | Horiguchi .................... 370/342 |
| 5,872,807 A | 2/1999 | Booth et al. ................. 375/130 |
| 5,898,617 A | 4/1999 | Bushey et al. ............ 365/185.2 |
| 5,914,980 A | 6/1999 | Yokota et al. ............... 375/130 |
| 6,046,603 A | 4/2000 | New ............................. 326/38 |
| 6,046,646 A | * 4/2000 | Lo et al. ........................ 331/10 |
| 6,057,704 A | 5/2000 | New et al. ..................... 326/38 |
| 6,057,739 A | * 5/2000 | Crowley et al. .............. 331/14 |
| 6,081,164 A | 6/2000 | Shigemori et al. ............ 331/16 |
| 6,091,263 A | 7/2000 | New et al. ..................... 326/40 |
| 6,181,158 B1 | 1/2001 | Cheung et al. ................ 326/38 |
| 6,263,011 B1 | 7/2001 | Paik et al. ................... 375/149 |
| 6,275,077 B1 | 8/2001 | Tobin et al. ................. 327/108 |
| 6,282,249 B1 | * 8/2001 | Tomesen et al. ............ 375/327 |
| 6,366,174 B1 | 4/2002 | Berry et al. ................... 331/78 |
| 6,389,092 B1 | * 5/2002 | Momtaz ....................... 375/376 |
| 6,417,739 B1 | * 7/2002 | Chacko ......................... 331/17 |
| 6,424,209 B1 | * 7/2002 | Gorecki et al. ............. 327/554 |
| 6,441,660 B1 | * 8/2002 | Ingino, Jr. ................... 327/156 |
| 6,462,594 B1 | * 10/2002 | Robinson et al. ........... 327/159 |

FOREIGN PATENT DOCUMENTS

| | | |
|---|---|---|
| EP | 0 655 829 A1 | 5/1995 |
| EP | 1 020 995 A1 | 7/2000 |

\* cited by examiner

*Primary Examiner*—Timothy P. Callahan
*Assistant Examiner*—Cassandra Cox
(74) *Attorney, Agent, or Firm*—Morrison & Foerster LLP

(57) ABSTRACT

A PLL circuit is described. The PLL circuit includes: a feedback loop and a loop filter coupled to the feedback loop, where the loop filter is programmable to provide one of a plurality of bandwidths. In one embodiment, the loop filter is programmable to provide one of a plurality of resistances, each resistance of the plurality of resistances corresponding to one of the plurality of bandwidths. In one embodiment, the feedback loop includes a detector and a signal generator coupled to the detector.

46 Claims, 9 Drawing Sheets

PROGRAMMABLE LOOP BANDWIDTH IN PHASE LOCKED LOOP (PLL) CIRCUIT

CROSS-REFERENCE TO RELATED APPLICATIONS

This application claims the benefits of U.S. Provisional Application Ser. Nos. 60/289,268 and 60/289,245, filed May 6, 2001, and entitled "Programmable Loop Bandwidth In Phase Locked Loop (PLL) Circuit" and "Phase Lock Loop (PLL) And Delay Lock Loop (DLL) Counter And Delay Element Programming In User Mode", respectively.

This application is being filed concurrently with (1) the U.S. Patent Application of Gregory W. Starr, Yen-Hsiang Chang, and Edward P. Aung for "Phase in Locked Loop (PLL) And Delay Locked Loop DLL) Counter And Delay Element Programming In User Mode", (2) the U.S. Patent Application of Wanli Chang and Gregory W. Starr for "Programmable Current Reference Circuit", and (3) the U.S. Patent Application of Gregory W. Starr and Wanli Chang for "Analog Implementation of Spread Spectrum Frequency Modulation In A Programmable Phase Locked Loop (PLL) System", and incorporates the material therein by reference.

BACKGROUND OF THE INVENTION

1. Field of the Invention

This invention relates generally to electronic circuits and, in particular, to phase locked loop (PLL) circuits used in electronic circuits.

2. Description of the Related Art

PLL circuits are used in many different context. In PLL circuits, an output frequency is locked into a reference frequency. The loop filter of a PLL circuit determines its operating bandwidth. In existing PLL circuits, the bandwidth of the loop filter is constant. Therefore, the operating bandwidth of the PLL circuit is also constant. This limits the usefulness of the PLL circuit.

The present invention addresses this and other disadvantages of existing PLL circuits.

SUMMARY OF THE INVENTION

The present invention encompasses a PLL circuit. In one embodiment, the PLL circuit of the present invention includes: a feedback loop and a loop filter coupled to the feedback loop, where the loop filter is programmable to provide one of a plurality of bandwidths. In one embodiment, the loop filter is programmable to provide one of a plurality of resistances, each resistance of the plurality of resistances corresponding to one of the plurality of bandwidths. In one embodiment, the feedback loop include a detector and a signal generator coupled to the detector.

The present invention is explained in more detail below with reference to the drawings.

DETAILED DESCRIPTION OF THE INVENTION

The present invention comprises a PLL circuit with a variable bandwidth. The following description is presented to enable any person skilled in the art to make and use the invention, and is provided in the context of a particular application and its requirements. Various modifications to the embodiments shown will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

The present invention is primarily described and claimed with reference to a PLL circuit. It is to be noted, however, that PLL and delay locked loop (DLL) circuits are herein used interchangeably. Therefore, references herein to a PLL circuit, either in the description or claims, are not limited to PLL circuits but encompass DLL circuits as well.

Figure 1:
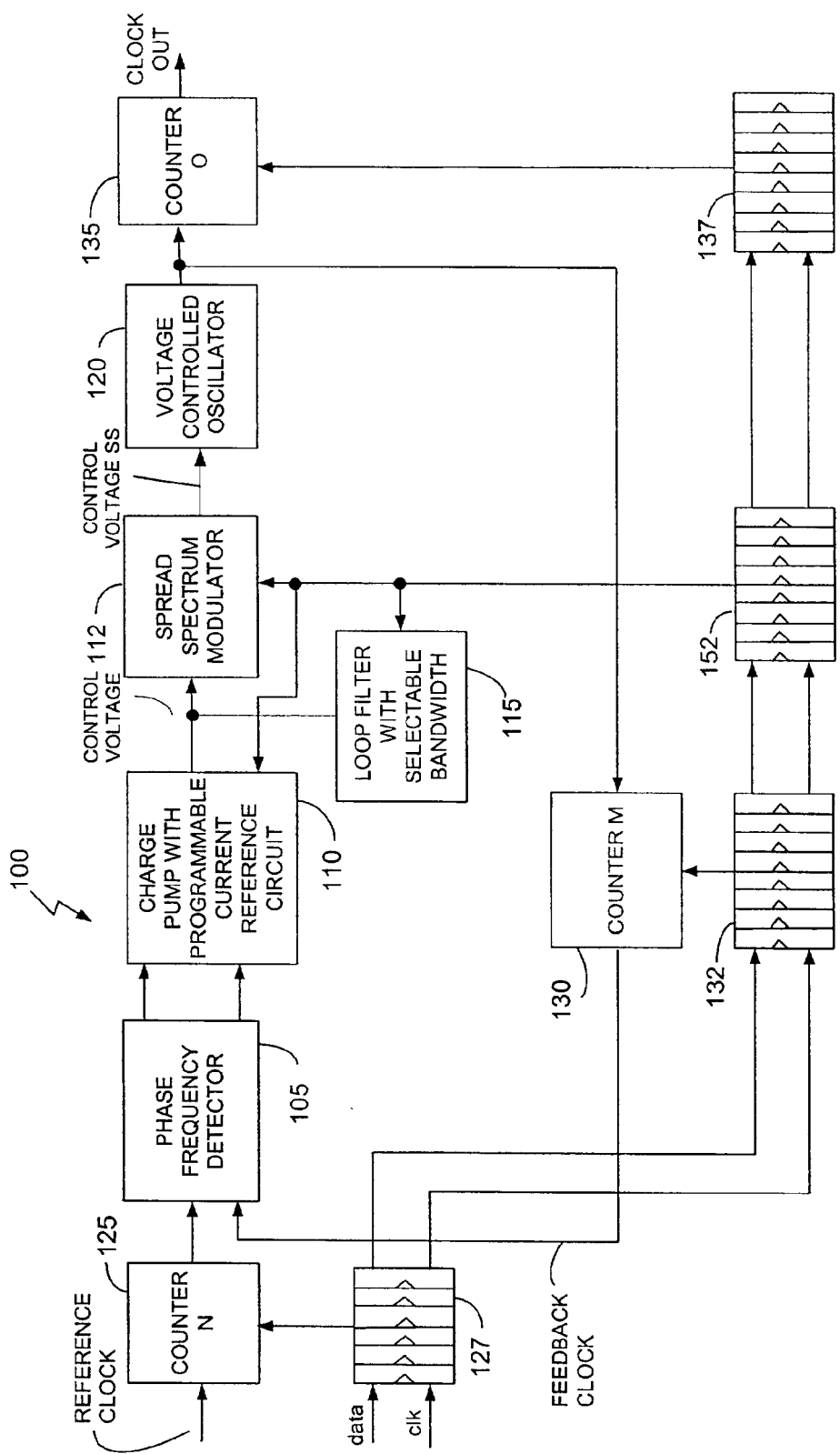
FIG. 1 is a block diagram of one embodiment of the PLL circuit of the present invention.

FIG. 1 is a block diagram of one embodiment of the PLL circuit 100 of the present invention. In FIG. 1, the PLL circuit 100 includes a phase frequency detector (PFD) 105, a charge pump (CP) 110 with a programmable current reference circuit, a spread spectrum modulator 112, a loop filter 115 with a selectable bandwidth, a voltage controlled oscillator (VCO) 120, counter N 125, counter M 130, and counter O 135. The loop filter with selectable bandwidth may also herein be referred to as a loop filter with programmable bandwidth (or programmable bandwidth loop filter) or a loop filter with variable bandwidth (or variable bandwidth loop filter).

Also shown in FIG. 1 are shift registers 127, 132, 152, and 137, which in one embodiment include D-type flip-flops. Shift registers 127, 132, and 137 are coupled to counter N 125, counter M 130, and counter O 135, respectively. Shift registers 152 may be coupled to the CP 110, the loop filter 115, and the spread spectrum modulator 112. In one embodiment, shift registers 152 are coupled to corresponding hold registers of the CP 110, the loop filter 115, and the spread spectrum modulator 112.

In one embodiment, the spread spectrum modulator 112 is an analog modulator. In one embodiment, the spread spectrum modulator 112 is programmable in user mode using shift registers 152. An analog spread spectrum modulator is described in greater detail in the U.S. Patent Application of Gregory W. Starr and Wanli Chang for "Analog Implementation of Spread Spectrum Frequency Modulation In A Programmable Phase Locked Loop (PLL) System" which is filed concurrently with this application and is incorporated herein by reference. In one embodiment of the PLL circuit 100, the spread spectrum modulator 112 is a digital, rather than an analog, modulator. In yet another embodiment, the PLL circuit 100 of the present invention may be one that does not include the spread spectrum modulator 112.

Counters N, M, and O may also be referred to as dividers N, M, and O. The output of each of dividers N, M and 0 is equal to its respective input divided by N, M, and O, respectively. In one embodiment, each of N, M, and O are integers. In another embodiment, N, M, and O may be non-integers. In one embodiment, each of N, M, and O are equal to one. In another embodiment, the PLL may be without one or more of the dividers N, M, and O. In one embodiment, each of counters N, M, and O and their associated delays may be programmed in user mode, i.e., their count and delay settings may be programmed in user mode. The U.S. Patent Application of Gregory W. Starr, Yen-Hsiang Chang, and Edward P. Aung for "Phase Lock Loop (PLL) And Delay Lock Loop (DLL) Counter And Delay Element Programming In User Mode", which is filed concurrently with this application and is incorporated herein by reference, describes such counters.

The PFD 105 compares the feedback clock signal with a divided version of the reference clock signal, i.e., after the reference clock signal is passed through divider N 125. Depending on the difference between the two signals compared by the PFD 105 (i.e., depending on whether the VCO 120 needs to operate at a higher or lower frequency), either an up or down signal is provided to the charge pump 110. In response, the charge pump 110 increases current supplied to the loop filter 115 or reduces current in the loop filter 115. As a result, a higher or lower control voltage is applied to the spread spectrum modulator 112. The spread spectrum modulator 112 produces a control voltage SS signal, which is a result of the spread spectrum modulation of the control voltage by the spread spectrum modulator 112. The VCO 120 generates a signal (e.g., a waveform) whose frequency depends on the control voltage (or more specifically, the control voltage SS).

Figure 2:
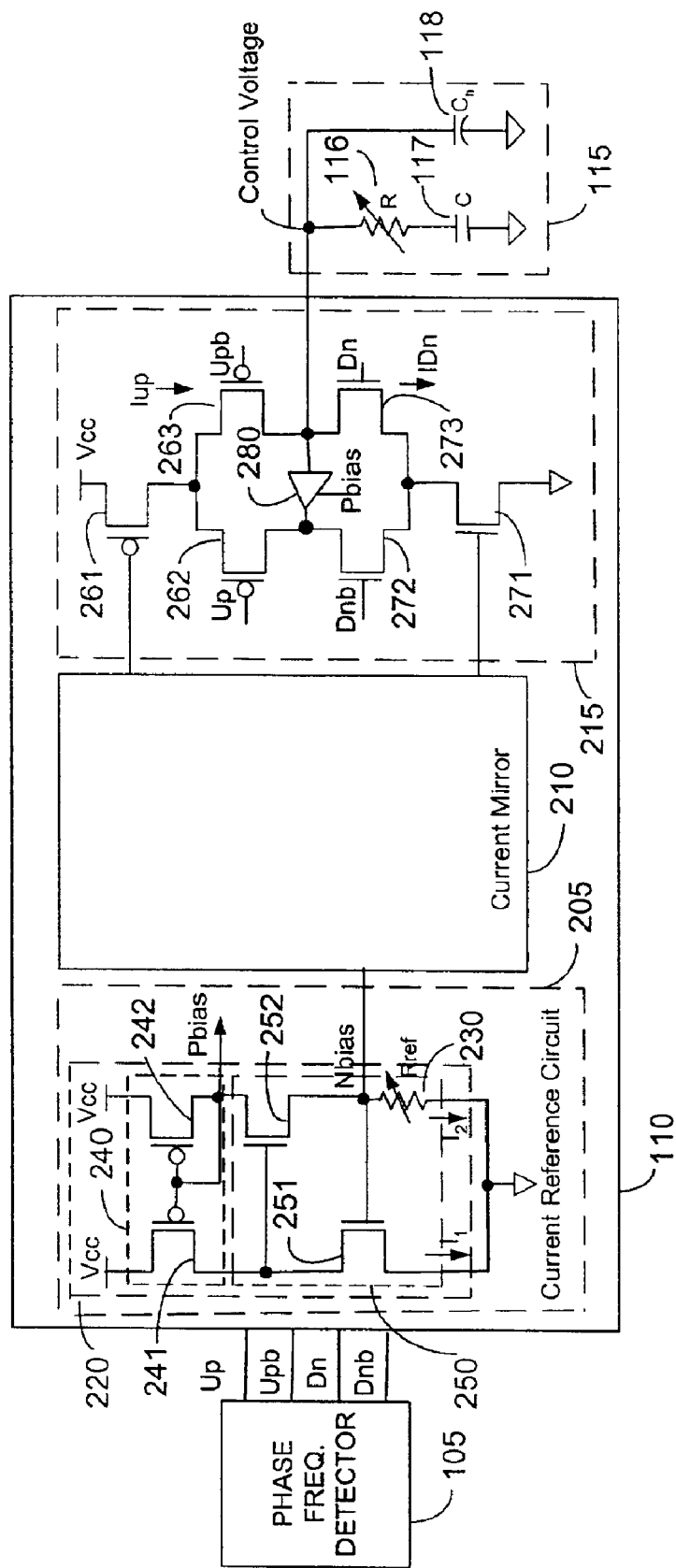
FIG. 2 is a circuit diagram of a portion of the PLL circuit of FIG. 1.

FIG. 2 is a more detailed diagram of a portion of one embodiment of the PLL circuit of the present invention. As shown in FIG. 2, in one embodiment, the charge pump 10 includes a programmable current reference circuit 205, a current mirror 210, and a current up/down circuit 215. The current up/down circuit includes current sources 261 and 271 which are used to increase the current supplied to the loop filter 115 and reduce current in the loop filter 115, respectively. In one embodiment, the programmable current reference circuit 205 is programmable in user mode using shift registers 152. The CP 10 with a programmable current reference circuit is described in greater detail in the U.S. Patent Application of Wanli Chang and Gregory W. Starr for "Programmable Current Reference Circuit" which is filed concurrently with this application and is incorporated herein by reference. In another embodiment, a CP without a programmable current reference circuit, but with a standard current reference circuit, may be used in the PLL circuit 100 of the present invention.

Also shown in FIG. 2 is a programmable bandwidth loop filter 115 of the present invention. As can be seen in FIG. 2, in one embodiment, the programmable bandwidth loop filter 115 includes a variable resistor R 116 and capacitors C 117 and $C_h$ 118. In one embodiment, capacitor C 117 has a capacitance that is approximately ten or more times greater than the capacitance of capacitor $C_h$ 118. In one embodiment, the programmable bandwidth loop filter 115 may be programmed in user mode using shift registers 152.

Figure 3:
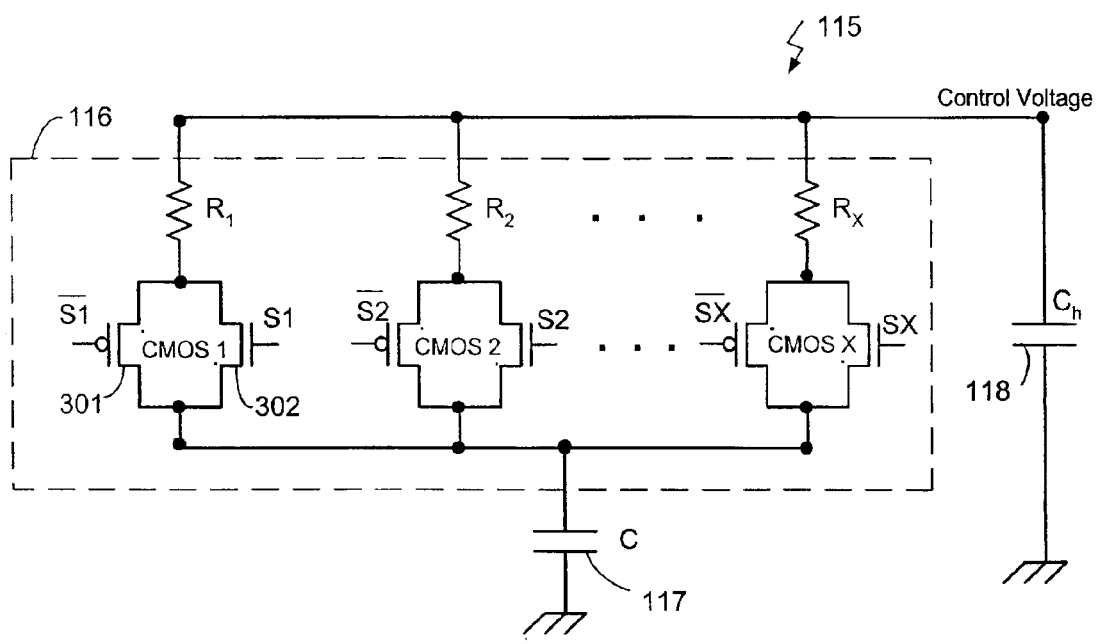
FIG. 3 is a circuit diagram of one embodiment of the programmable loop filter of the present invention.

FIG. 3 is a detailed circuit diagram of one embodiment of the programmable bandwidth loop filter 115 of the present invention. In FIG. 3, a number of resistors $R_1$ through $R_X$ are coupled in parallel, where X is an integer and in this specific case is equal to or greater than 3. More generally X is an integer equal to or greater than 1. As can be seen in FIG. 3, each of the resistors $R_1$ through $R_X$ is coupled in series with complementary metal oxide semiconductor (CMOS) transistors, i.e., a combination of an n-channel MOS transistor and a p-channel MOS transistor. Each of the PMOS and NMOS transistors will introduce a series resistance that varies as a function of the control voltage, process, temperature, and voltage supply. By turning on one or more of the appropriate CMOS transistors and turning off the remaining CMOS transistors, a desired overall resistance may be obtained. In one embodiment, each of resistors $R_1$ through $R_X$ has a different resistance. In another embodiment, two or more of the resistors $R_1$ and $R_X$ have the same resistance. Moreover, in one embodiment, the resistance from each CMOS transistor (i.e., the combination of a PMOS transistor and its corresponding NMOS transistor) is approximately 10% or less of the combined resistance of the CMOS transistor and the resistance of the one resistor $R_1$ through $R_X$ to which it is coupled in series. In one embodiment, one or more of resistors $R_1$ to $R_X$ may comprise a plurality of resistors. Thus, for example, resistor $R_1$ may comprise a plurality of resistors coupled in series.

Figure 4:
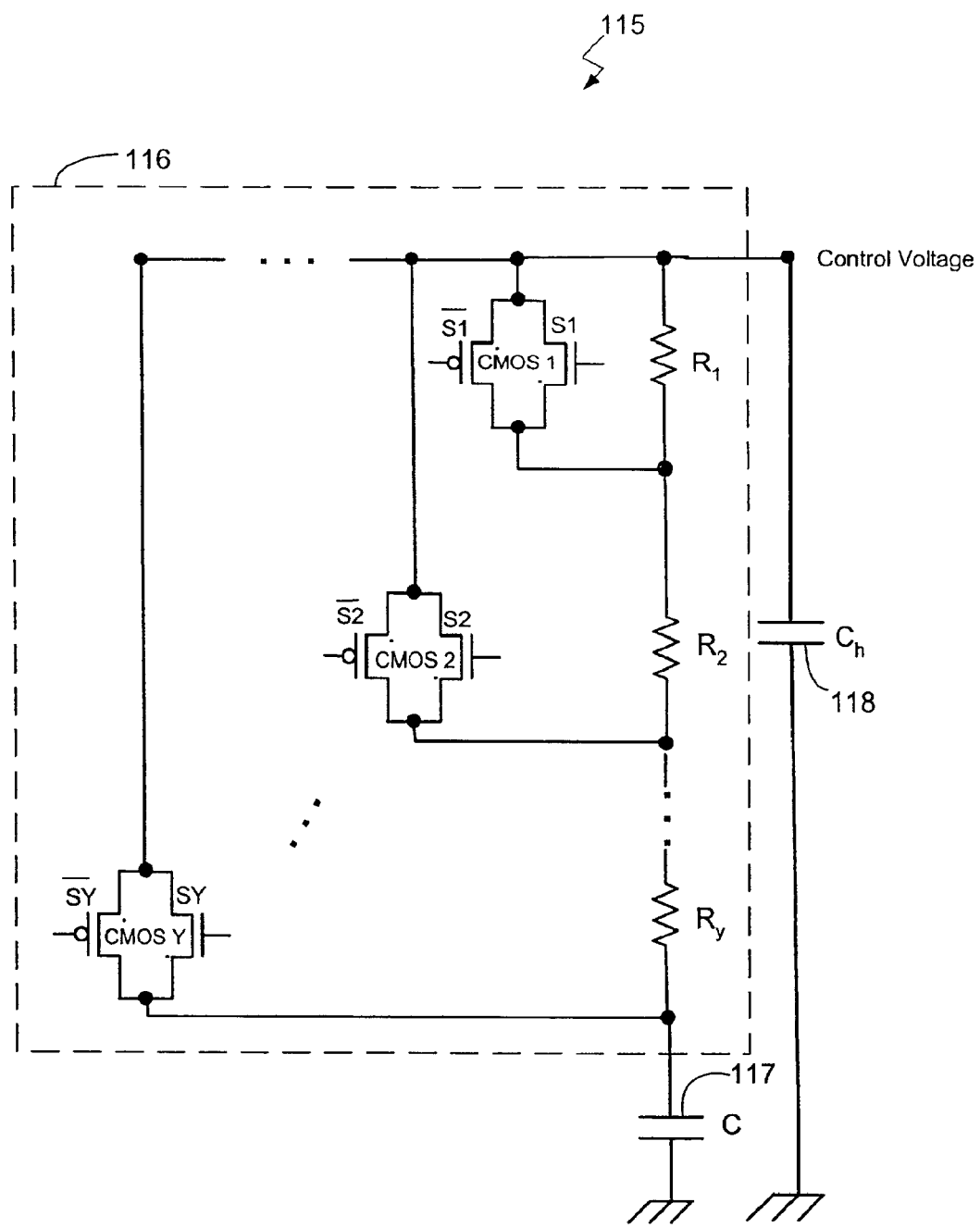
FIG. 4 is a circuit diagram of a second embodiment of the programmable loop filter of the present invention.

FIG. 4 is a detailed circuit diagram of a second embodiment of the programmable bandwidth loop filter of the present invention. In FIG. 4, resistors $R_1$ through $R_Y$ are coupled in series, where Y is an integer and in this specific embodiment is equal to or greater than 3. More generally, Y is an integer equal to or greater than 1. As can be seen in FIG. 4, CMOS transistors 1 through Y are coupled across one or more of the resistors $R_1$ through $R_Y$. In one embodiment, the CMOS transistors have a relatively small resistance. This allows to effectively short around the desired resistors in the series $R_1$ through $R_Y$ to obtain the desired overall resistance. In one embodiment, all of the resistors $R_1$ through $R_Y$ have the same resistance. In another embodiment, each of the resistors $R_1$ and $R_Y$ has a different resistance. By turning on one or more of the rip appropriate CMOS transistors and turning off the remaining CMOS transistors, a desired overall resistance may be obtained.

Figure 5:
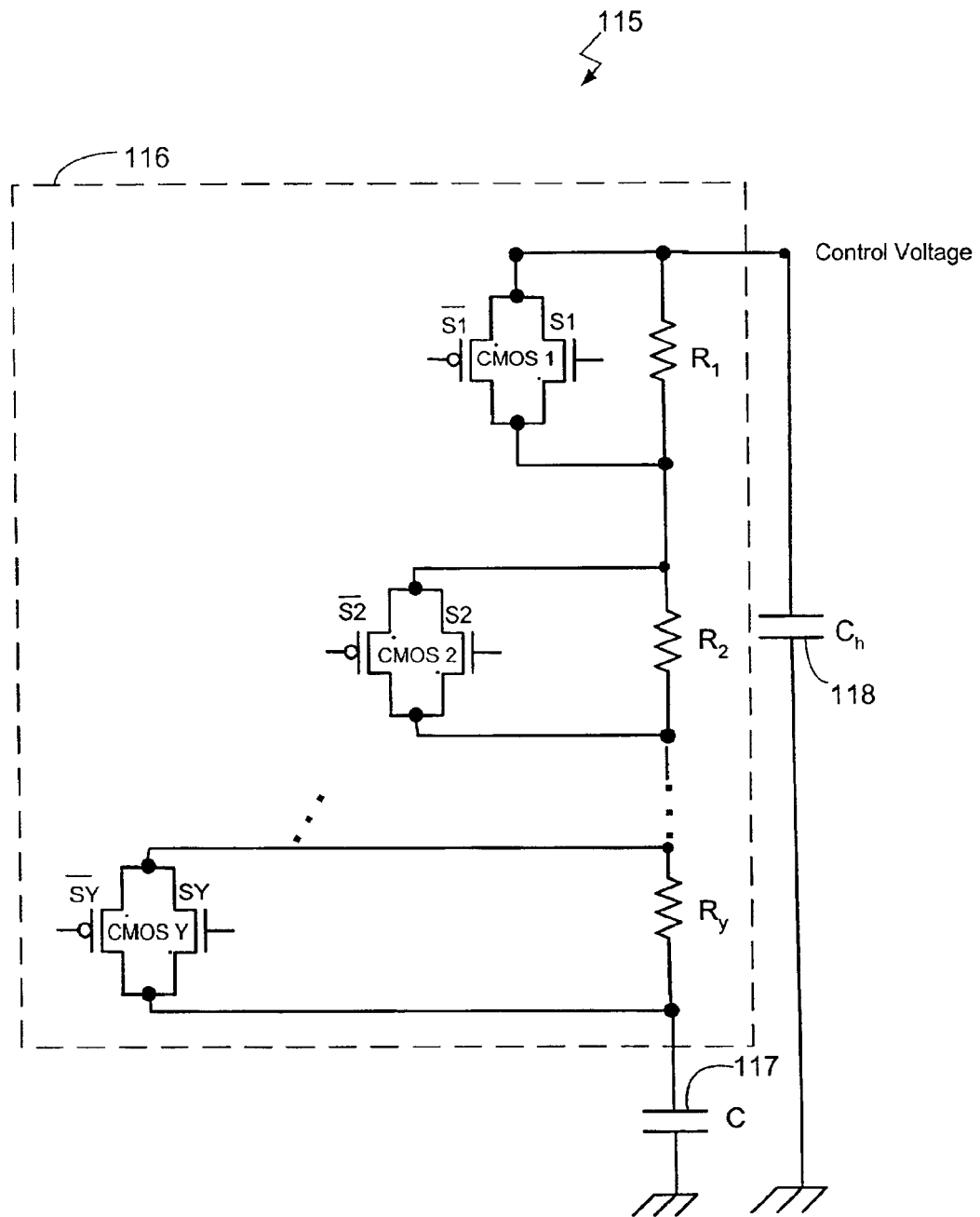
FIG. 5 is a circuit diagram of a third embodiment of the programmable loop filter of the present invention.

FIG. 5 is a detailed circuit diagram of a third embodiment of the programmable bandwidth loop filter 115 of the present invention. In the embodiment shown in FIG. 5, each of CMOS transistors CMOS 1 to CMOSY provides a shorting path around one, rather than a plurality, of resistors $R_1$ to $R_Y$. As can be seen in FIG. 5, transistors CMOS1 to CMOSY provide a shorting path around resistors $R_1$ to $R_Y$, respectively.

In the embodiments shown in FIGS. 4 and 5, there are no CMOS transistors coupled in series with the resistors $R_1$ to $R_Y$. In another embodiment, there may be a CMOS transistor coupled in series with resistors $R_1$ to $R_Y$.

Figure 6:
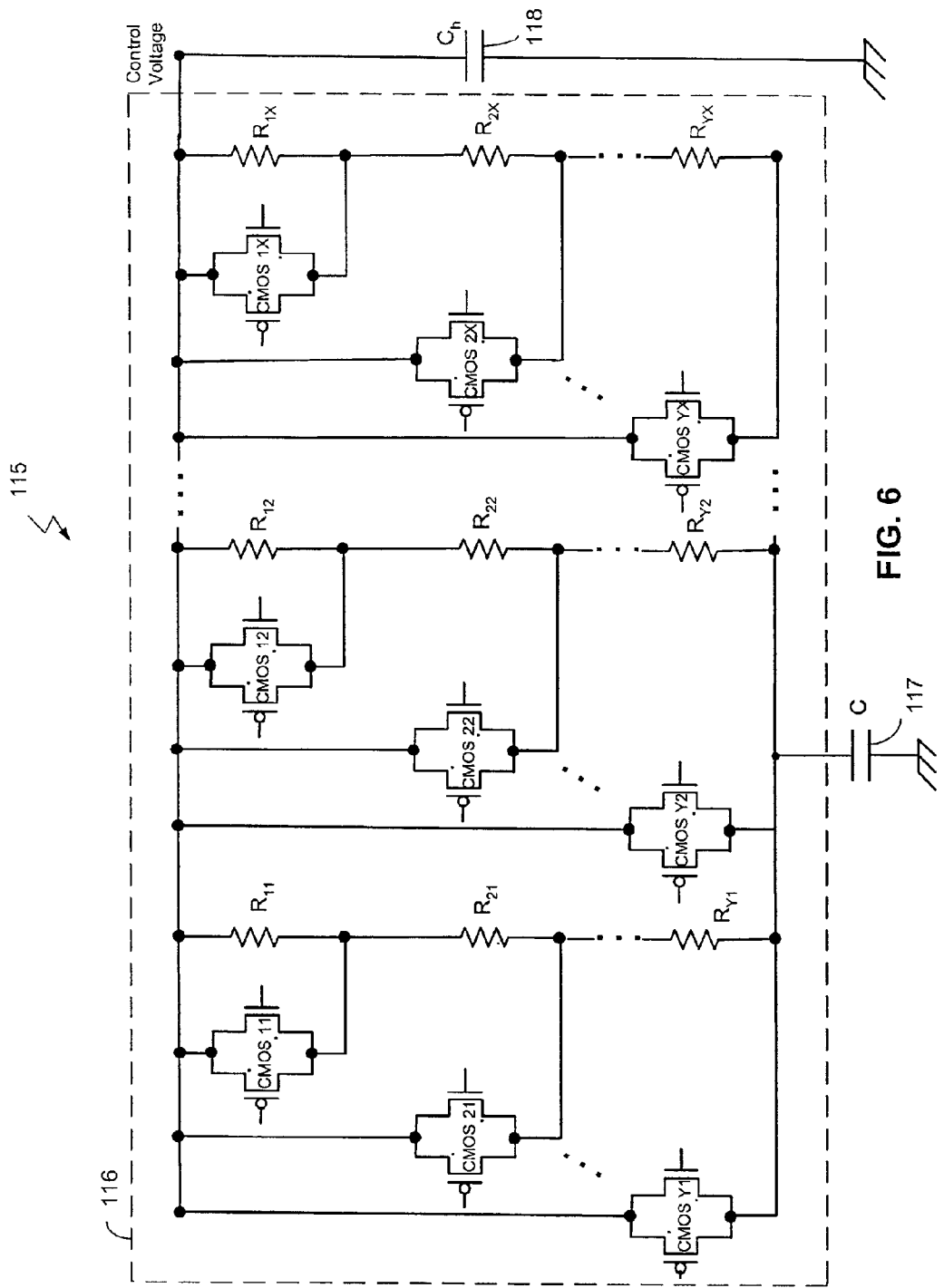
FIG. 6 is a circuit diagram of a fourth embodiment of the programmable 6& loop filter of the present invention.

FIG. 6 is a detailed circuit diagram of a fourth embodiment of the programmable bandwidth loop filter 115 of the present invention. In the embodiment shown in FIG. 6, there is a combination of both parallel and serial resistances. By turning on one or more of the appropriate CMOS transistors and turning off the remaining CMOS transistors, a desired overall resistance may be obtained. As can be seen in FIG. 6, turning on any one of CMOSY1 through CMOSYX would short all the resistors $R_{11}$ through $R_{YX}$. Thus, having only one of CMOSY1 through CMOSYX is sufficient for shorting all resistors $R_{11}$ through $R_{YX}$. In one embodiment, all of the resistors $R_{11}$ through $R_{YX}$ have the same resistance. In another embodiment, each of the resistors $R_{11}$ and $R_{YX}$ has a different resistance.

Figure 7:
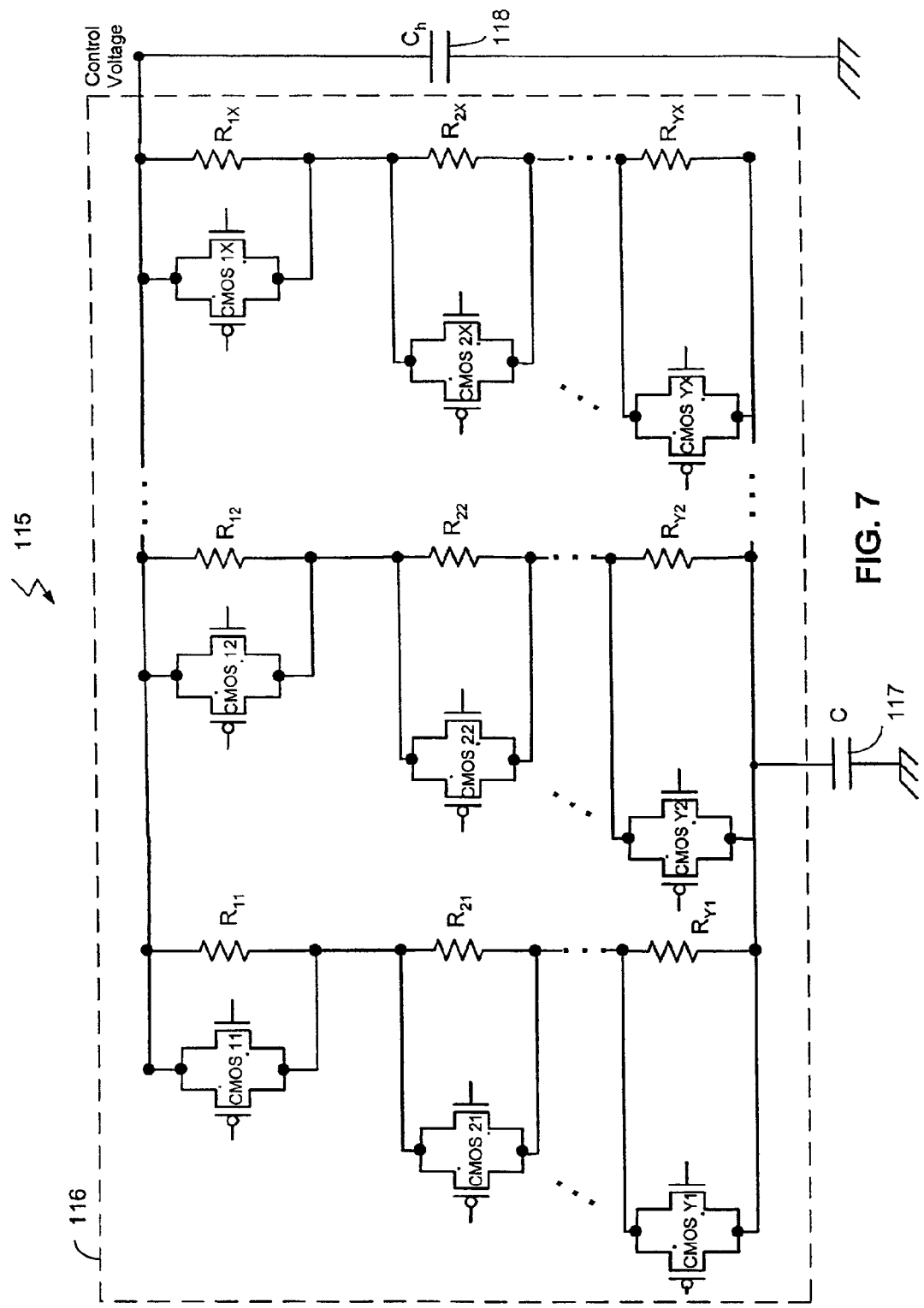
FIG. 7 is a circuit diagram of a fifth embodiment of the programmable loop filter of the present invention.

FIG. 7 is a detailed circuit diagram of a fifth embodiment of the programmable bandwidth loop filter 115 of the present invention. In FIG. 7, as in FIG. 5, each of the CMOS transistors provides a shorting path around one resistor. As can be seen in FIG. 7, transistors CMOS11 to CMOSYX provide a shorting path around resistors $R_{11}$ to $R_{YX}$, respectively.

In the embodiments shown in FIGS. 6 and 7, there are no CMOS transistors coupled in series with the resistors $R_{11}$ to $R_{YX}$. In another embodiment, there may be a CMOS transistor coupled in series with resistors $R_{11}$ to $R_{YX}$. In one such embodiment, there may be a CMOS transistor coupled in series with resistors $R_{11}$ to $R_{Y1}$. Similarly, each of the other series resistors $R_{12}$ to $R_{Y2}$, $R_{12}$ to $R_{Y2}$, ..., $R_{1X}$ to $R_{YX}$ may have a CMOS transistor coupled in series therewith.

As can be seen in FIGS. 3–7, for each CMOS, e.g., CMOS1, the source of the PMOS transistor 301 is coupled to the drain of the NMOS transistor 302, while the drain of the PMOS transistor 301 is coupled to the source of the NMOS transistor 302. In one embodiment, some other switching device may be used in place of CMOS transistors. For example, single PMOS or NMOS transistors may be used rather than a combination of the PMOS transistor and NMOS transistor making up a CMOS transistor. In another embodiment, a fuse, rather than a transistor, may be used as a switch.

Use of a variable resistance in the loop filter of the present invention allows varying the bandwidth of the loop filter and, therefore, that of the PLL circuit. More specifically, in one embodiment, it allows shifting the bandwidth of the loop filter. As can be seen in the below open loop gain equation and the corresponding equations for $\tau_z$ and $\tau_p$, both the pole ($\tau_p$) and zero ($\tau_z$) are a function of the resistance of the loop filter:

$$GH(s) = \frac{I_{qp} K_{VCO}}{2\pi M} \frac{1 + s\tau_z}{s^2 (C + C_h)(1 + s\tau_p)}$$

where: $\tau_z = RC$;

$$\tau_p = R \left( \frac{1}{C} + \frac{1}{C_h} \right)^{-1};$$

$I_{qp}$ is the charge pump current;
$K_{VCO}$ is the gain of the VCO; and
M is the counter value (or divide factor) for the counter M. Thus, varying the resistance of the loop filter allows moving the pole and zero positions. When varying the overall resistance R, the ratio between the zero and pole values will remain the same or substantially the same, but the position of both the zero and pole will change. This allows an effective shift in the open loop bandwidth.

Figure 8:
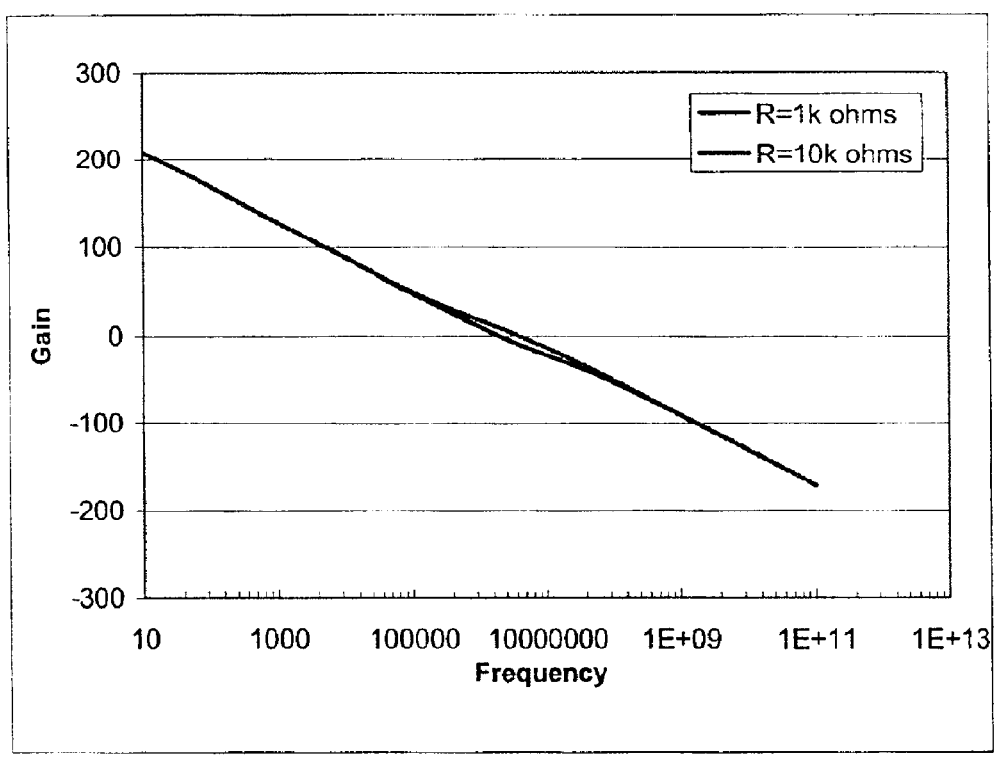
FIG. 8 is a graph of the loop gain versus frequency for two different overall resistance values R.
Figure 9:
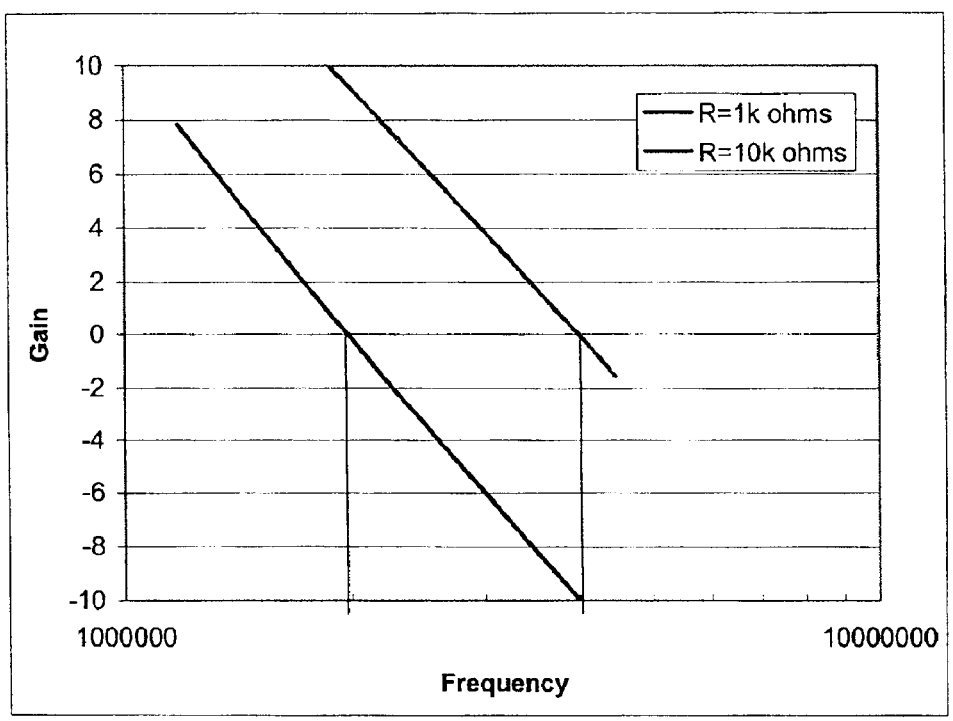
FIG. 9 is a zoomed view of a portion of the graph in FIG. 8.

FIG. 8 is a graph of the loop gain versus frequency for two different overall resistance values R. FIG. 9 is a zoomed view of a portion of the graph in FIG. 8. FIGS. 8 and 9 show the shift in the bandwidth if the resistor value is varied by a factor of ten. By changing the resistor value a factor of ten, it is possible to shift the bandwidth by a factor of 2.

The programmable bandwidth of the present invention allows the PLL circuit to operate over a wide range of frequencies. In one embodiment, it allows the PLL circuit to operate over a frequency range of 100 kHz to 10 MHz. Use of a reprogrammable PLL circuit with a variable bandwidth allows for using one rather than multiple PLL circuit's to effectively operate in multiple bandwidths.

Furthermore, the variable resistance of the present invention allows for jitter control in the output clock. As jitter amplification is inversely proportional to the resistance R of the loop filter, varying (selecting or programming R) allows varying the amount of jitter amplification. More specifically, it allows suppressing jitter amplification. It also allows increasing jitter amplification when that is desired for the specific application.

Like the bandwidth of the PLL circuit, its phase characteristic is also a function of the resistance R. Thus, varying the resistance R in the loop filter, shifts both the bandwidth and the phase characteristic of the PLL circuit in the frequency domain. This provides greater stability by the PLL circuit of the present invention since a desired phase margin and bandwidth relation is maintained.

Accordingly, the loop bandwidth can be adjusted to meet the stability and jitter performance requirement of different PLL circuit applications. Thus, the PLL circuit of the present invention allows for improved circuit stability as well as jitter performance over a wide range of operating conditions.

In one embodiment of the present invention, the overall resistance R 116 of the loop filter 115 may also be varied by varying the resistance of the CMOS transistors. As noted above, the resistance of the MOS varies with the size of the MOS, the process by which the MOS is made, the temperature, the control voltage applied to the MOS, the supply voltage used on the MOS, and the gate voltage applied to the MOS. In one embodiment, one or more of these factors is used to control the resistance of the MOS transistors. In one embodiment, the control voltage and gate voltages (i.e., voltages applied to the gates of the MOS transistors) are varied to select a higher CMOS resistance prior to locking onto the reference clock signal. This increases the overall resistance R 116 in the loop filter 115. As the overall resistance R 116 is coupled in series with C 117 rather than $C_h$ 118 (which as noted above has a much smaller capacitance than C 117), increasing the overall resistance R 116 in effect decreases the overall capacitance of the loop filter. The decreased overall capacitance of the loop filter allows for providing faster changes in the control voltage provided to the VCO 120. As a result, the PLL circuit locks into the reference clock signal faster.

In one embodiment, either one or both of capacitors C 117 and $C_h$ 118 have a variable capacitance. In one embodiment, the variable capacitors are programmable capacitors. In one embodiment, a programmable capacitance is achieved using a similar configuration to those used in FIGS. 3–7 for making resistance R programmable. In one embodiment, a plurality of capacitors are coupled in parallel. Moreover, in one embodiment, each of the capacitors is coupled in series with a CMOS transistor. In another embodiment, a plurality of capacitors are coupled in series. Moreover, in one embodiment, CMOS transistors are coupled across one or more of the capacitors in the series. In yet another embodiment, there are a combination of both parallel and series capacitors. In other words, there are a plurality of capacitances coupled in parallel, where each of the capacitances includes a plurality of capacitors coupled in series. In one embodiment, CMOS transistors are coupled across one or more of the capacitors. Also, in one embodiment, there may be a CMOS transistor coupled in series with each series of capacitors. Use of variable capacitance(s) in the loop filter of the present invention allows varying the bandwidth of the loop filter and, therefore, that of the PLL circuit. More specifically, in one embodiment, it allows shifting the bandwidth of the loop filter.

In one embodiment, some other switching device may be used in place of CMOS transistors. For example, single PMOS or NMOS transistors may be used rather than a combination of the PMOS transistor and NMOS transistor making up a CMOS transistor. In another embodiment, a fuse, rather than a transistor, may be used as a switch.

In one embodiment, shift registers 152 are coupled to the CMOS switches shown in FIGS. 3–7. More specifically, in one embodiment, they are coupled to the gates of these CMOS switches. Accordingly, the outputs of the shift registers 152 determine the state of the CMOS switches and the overall resistance of resistor R 116. Therefore, using shift registers 152, resistor R 116 is programmable in user mode. Similarly, using shift registers 152, capacitors C 117 and $C_h$ 118 are also programmable in user mode. In one embodiment, there are hold registers between the CMOS switches and shift registers 152. The hold registers receive data from shift registers 152. Thereafter, the hold registers supply the data to the CMOS switches.

The PLL circuit of the present invention may be used in many systems. For example, the PLL circuit may be used in a digital system. More specifically, the PLL circuit may be used in a digital system comprising a programmable logic device (PLD), which as used herein also refers to complex PLD's (CPLD's). Additionally, the PLL circuit may be used in a PLD. In one embodiment, the PLL circuit is on the same die/chip as the PLD. In one embodiment, the loop filter bandwidth may be reprogrammed to select a different bandwidth in real time while the PLD is in user mode. As used herein a digital system is not intended to be limited to a purely digital system, but also encompasses hybrid systems that include both digital and analog subsystems. Thus, the present invention encompasses digital systems that include the PLL circuit described herein.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A phase locked loop circuit comprising:
   a feedback loop; and
   a loop filter coupled to the feedback loop, wherein the loop filter is programmable in user mode to provide one of a plurality of bandwidths.

2. The phase locked loop circuit of claim 1, wherein the loop filter is programmable to provide one of a plurality of resistances, each resistance of the plurality of resistances corresponding to one of the plurality of bandwidths.

3. The phase locked loop circuit of claim 1, wherein the loop filter is programmable to provide one of a plurality of capacitances, each capacitance of the plurality of capacitances corresponding to one of the plurality of bandwidths.

4. The phase locked loop circuit of claim 1, wherein the feedback loop comprises:
   a detector; and
   a signal generator coupled to the detector.

5. The phase locked loop of claim 4, wherein the feedback loop further comprises a first divider coupled to the signal generator and a first input node of the detector, wherein the first divider receives a signal generator output signal from the signal generator and provides a first input signal to the first input node of the detector.

6. The phase locked loop of claim 5 further comprising:
   a second divider coupled to a second input node of the detector; and
   a third divider coupled to the signal generator;
   wherein the second divider receives a reference clock signal and provides a second input signal to the second input node of the detector, further wherein the third divider receives the signal generator output signal from the signal generator and provides an output clock signal.

7. The phase locked loop of claim 6, wherein the first input signal is at a first input signal frequency and the signal generator output signal is at a signal generator output signal frequency that is greater than the first input signal frequency, further wherein the second input signal is at a second input signal frequency and the reference clock signal is at a reference clock signal frequency that is greater than the second input signal frequency, and further wherein the output clock signal is at an output clock signal frequency that is smaller than the signal generator output signal frequency.

8. The phase locked loop circuit of claim 6, wherein each of the first, second, and third dividers is programmable in user mode.

9. The phase locked loop circuit of claim 4, wherein the feedback loop further comprises a charge pump coupled to the detector and the loop filter, wherein the charge pump comprises a programmable current reference circuit.

10. The phase locked loop circuit of claim 9, wherein the feedback loop further comprises a spread spectrum modulator coupled to the charge pump, the loop filter and the signal generator, further wherein the spread spectrum modulator is an analog spread spectrum modulator.

11. The phase locked loop circuit of claim 1, wherein the loop filter comprises a plurality of resistances coupled in parallel, wherein each resistance of the plurality of resistances comprises at least one resistor and a switch coupled in series with the at least one resistor.

12. The phase locked loop circuit of claim 11, wherein the loop filter further comprises:
    a first capacitor; and
    a second capacitor, wherein the plurality of parallel resistances are coupled in series with the first capacitor, further wherein the second capacitor is coupled in parallel with a series combination of the plurality of the parallel resistances and the first capacitor.

13. The phase locked loop circuit of claim 1, wherein the loop filter comprises:
    a plurality of resistors coupled in series; and
    a plurality of shorting routes, wherein each shorting route comprises a switch and is coupled across at least one resistor of the plurality of resistors.

14. The phase locked loop circuit of claim 13, wherein the loop filter further comprises:
    a first capacitor coupled in series with the plurality of resistors; and
    a second capacitor coupled in parallel with a series combination of the plurality of resistors and the first capacitor.

15. The phase locked loop circuit of claim 1, wherein the loop filter comprises:
    a plurality of resistances coupled in parallel, wherein each resistance of the plurality of resistances comprises a plurality of resistors coupled in series; and
    a plurality of shorting routes, wherein each shorting route comprises a switch and is coupled across at least one resistor of the plurality of resistors.

16. The phase locked loop circuit of claim 15, wherein the loop filter further comprises:
    a first capacitor; and
    a second capacitor, wherein the plurality of resistances are coupled in series with the first capacitor, further wherein the second capacitor is coupled in parallel with a series combination of the plurality of resistances and the first capacitor.

17. The phase locked loop circuit of claim 15, wherein each resistance of the plurality of resistances further comprises a switch coupled in series with the plurality of resistors.

18. A digital system including a programmable logic device and the phase locked loop circuit of claim 1.

19. A programmable logic device including the phase locked loop circuit of claim 1.

20. The phase locked loop circuit of claim 1, wherein the programmable loop filter bandwidth allows the phase locked loop circuit to operate over a frequency range of 100 kHz to 10 MHz.

21. The phase locked loop circuit of claim 1, wherein the loop filter comprises at least one switch, further wherein resistance of the at least one switch is varied prior to locking onto a reference clock signal.

22. A phase locked loop circuit comprising:
a signal generator; and
a loop filter coupled to the signal generator, wherein the loop filter is programmable in user mode to provide one of a plurality of bandwidths.

23. The phase locked loop circuit of claim 22, wherein the loop filter is programmable to provide one of a plurality of resistances, each resistance of the plurality of resistances corresponding to one of the plurality of bandwidths.

24. The phase locked loop circuit of claim 22, wherein the loop filter is programmable to provide one of a plurality of capacitances, each capacitance of the plurality of capacitances corresponding to one of the plurality of bandwidths.

25. The phase locked loop of claim 23 further comprising:
a detector coupled to the signal generator; and
a first divider coupled to the signal generator and a first input node of the detector, wherein the first divider receives a signal generator output signal from the signal generator and provides a first input signal to the first input node of the detector.

26. The phase locked loop of claim 25 further comprising:
a second divider coupled to a second input node of the detector; and
a third divider coupled to the signal generator;
wherein the second divider receives a reference clock signal and provides a second input signal to the second input node of the detector, further wherein the third divider receives the signal generator output signal from the signal generator and provides an output clock signal.

27. The phase locked loop of claim 26, wherein the first input signal is at a first input signal frequency and the signal generator output signal is at a signal generator output signal frequency that is greater than the first input signal frequency, further wherein the second input signal is at a second input signal frequency and the reference clock signal is at a reference clock signal frequency that is greater than the second input signal frequency, and further wherein the output clock signal is at an output clock signal frequency that is smaller than the signal generator output signal frequency.

28. The phase locked loop circuit of claim 22, wherein the loop filter comprises a plurality of resistances coupled in parallel, wherein each resistance of the plurality of resistances comprises at least one resistor and a switch coupled in series with the at least one resistor.

29. The phase locked loop circuit of claim 28, wherein the loop filter further comprises:
a first capacitor; and
a second capacitor, wherein the plurality of parallel resistances are coupled in series with the first capacitor, further wherein the second capacitor is coupled in parallel with a series combination of the plurality of the parallel resistances and the first capacitor.

30. The phase locked loop circuit of claim 22, wherein the loop filter comprises:
a plurality of resistors coupled in series; and
a plurality of shorting routes, wherein each shorting route comprises a switch and is coupled across at least one resistor of the plurality of resistors.

31. The phase locked loop circuit of claim 30, wherein the loop filter further comprises:
a first capacitor coupled in series with the plurality of resistors; and
a second capacitor coupled in parallel with a series combination of the plurality of resistors and the first capacitor.

32. The phase locked loop circuit of claim 22, wherein the loop filter comprises:

a plurality of resistances coupled in parallel, wherein each resistance of the plurality of resistances comprises a plurality of resistors coupled in series; and
a plurality of shorting routes, wherein each shorting route comprises a switch and is coupled across at least one resistor of the plurality of resistors.

33. The phase locked loop circuit of claim 32, wherein the loop filter further comprises:
a first capacitor; and
a second capacitor, wherein the plurality of resistances are coupled in series with the first capacitor, further wherein the second capacitor is coupled in parallel with a series combination of the plurality of resistances and the first capacitor.

34. The phase locked loop circuit of claim 32, wherein each resistance of the plurality of resistances further comprises a switch coupled in series with the plurality of resistors.

35. The phase locked loop circuit of claim 22 further comprising a charge pump coupled to the detector and the loop filter, wherein the charge pump comprises a programmable current reference circuit.

36. The phase locked loop circuit of claim 35 further comprising a spread spectrum modulator coupled to the charge pump, the loop filter and the signal generator, wherein the spread spectrum modulator is an analog spread spectrum modulator.

37. The phase locked loop circuit of claim 26, wherein each of the first, second, and third dividers is programmable in user mode.

38. A digital system including a programmable logic device and the phase locked loop circuit of claim 22.

39. A programmable logic device including the phase locked loop circuit of claim 22.

40. A method of providing an output clock signal, the method comprising:
comparing a feedback clock signal with a reference clock signal;
providing a control signal to a signal generator;
selecting in user mode one of a plurality of bandwidths in a loop filter; and
generating an output clock signal in response to the control signal.

41. The method of claim 40, wherein the selecting comprises selecting one of a plurality of resistances in the loop filter, wherein each resistance of the plurality of resistances has a corresponding bandwidth in the plurality of bandwidths.

42. The method of claim 40, wherein the selecting comprises selecting one of a plurality of capacitances in the loop filter, wherein each capacitance of the plurality of capacitances has a corresponding bandwidth in the plurality of bandwidths.

43. The phase locked loop circuit of claim 22, wherein the programmable loop filter bandwidth allows the phase locked loop circuit to operate over a frequency range of 100 kHz to 10 MHz.

44. The phase locked loop circuit of claim 22, wherein the loop filter comprises at least one switch, further wherein resistance of the at least one switch is varied prior to locking onto a reference clock signal.

45. The method of claim 40, wherein the selecting comprises selecting in user mode one of a plurality of bandwidths over a frequency range of 100 kHz to 10 MHz.

46. The method of claim 40, wherein the selecting comprises varying resistance of at least one switch in the loop filter.

* * * * *